United States Patent
Hasegawa et al.

[11] Patent Number: 5,906,717
[45] Date of Patent: May 25, 1999

[54] SPUTTERING TARGET OF SINGLE CRYSTAL ALUMINUM ALLOY

[75] Inventors: Masahiro Hasegawa, Osaka; Hitoshi Yasuda; Akihiko Takahashi, both of Ibaraki, all of Japan

[73] Assignee: Sumitomo Chemical Company, Limited, Osaka, Japan

[21] Appl. No.: 08/792,750

[22] Filed: Feb. 4, 1997

Related U.S. Application Data

[63] Continuation of application No. 08/429,569, Apr. 27, 1995, abandoned.

[30] Foreign Application Priority Data

Apr. 28, 1994 [JP] Japan .................................. 6-092321

[51] Int. Cl.⁶ .................................................. C23C 14/34
[52] U.S. Cl. ............................... 204/298.13; 204/192.12
[58] Field of Search ...................... 204/192.12, 298.13, 204/298.12

[56] References Cited

U.S. PATENT DOCUMENTS

| | | | |
|---|---|---|---|
| 5,087,297 | 2/1992 | Pouliquen | 204/298.12 X |
| 5,456,815 | 10/1995 | Fukuyo et al. | 204/298.13 |

FOREIGN PATENT DOCUMENTS

| | | | |
|---|---|---|---|
| 573002 | 12/1993 | European Pat. Off. | 204/298.13 |
| 124566 | 6/1986 | Japan | 204/298.13 |
| 405125523 | 5/1993 | Japan | 204/298.13 |
| 05309448 | 11/1993 | Japan . | |

OTHER PUBLICATIONS

Wickersham, Jr., "Crystallographic . . . sputtering", J. Vac. Sci. Technol. A5(4), Jul./Aug. 1987, pp. 1755–1758.

*Primary Examiner*—Nam Nguyen
*Attorney, Agent, or Firm*—Birch, Stewart, Kolasch & Birch, LLP

[57] ABSTRACT

A sputtering target of a single crystal aluminum alloy which has a uniform concentration distribution of an added metal element and a controlled crystal orientation is prepared using a continuous casting apparatus equipped with a starting rod by solidifying a melt of aluminum having a purity of at least 99.9 wt. % which contains 0.1 to 3.0 wt. % of at least one metal element selected from the group consisting of elements having atomic numbers of 3 to 83, at a casting temperature of 670 to 850° C. at a casting rate of 1 to 80 m/min. in one direction with maintaining an angle between a center axis of a continuous casting mold and a direction of pulling a casting material at 2 degrees or less.

3 Claims, 1 Drawing Sheet

SPUTTERING TARGET OF SINGLE CRYSTAL ALUMINUM ALLOY

This application is a continuation of application Ser. No. 08/429,569 filed on Apr. 27, 1995, now abandoned.

BACKGROUND OF THE INVENTION

1. Field of the Invention

The present invention relates to a sputtering target of a single crystal aluminum alloy which is set in a sputtering apparatus and used in the formation of a thin film, and a method for producing the same.

2. Description of the Related Art

A sputtering process comprises irradiating a sputtering target by an ion beam under reduced pressure, impacting the ions on a target surface to evaporate a material of the target, and depositing the material on a substrate to form a thin film of the material. The sputtering process is widely used for forming the thin film, and targets containing various elements are used for the improvement of properties of the formed thin films.

In the sputtering process, crystal orientations on the surface and in an interior of the target are known to have great influences on emitting properties of atoms from the target and, in turn, have influences on film forming properties such as a film formation speed and step coverage of the thin film formed on the substrate (cf. Phys. Rev., 102, 699 (1956)). Therefore, it is important to control the crystal orientations of the target for the formation of the thin film with good film properties.

Hitherto, a polycrystalline aluminum alloy has been used as a material for a sputter target, the crystal structure and orientations of which are adjusted by working or heat treating it. But, since this target consists of a polycrystalline alloy, it is impossible to fully control the crystal orientations in accordance with purposes of the use.

For the production of a single crystal material having controlled crystal orientations, there are known solidifying methods such as the Bridgeman method, the Charmars method and the Czochralski method. However, in a case of an alloy, a solute suffers from a solid-liquid separation during solidification, and added elements are segregated to provide a nonuniform distribution of elements in these solidifying methods.

For example, when an eutectic element such as Cu or Si is added to aluminum, the concentration of such an alloy element in a solid phase is lower than that in a liquid phase during the solidification, so that, with the progress of solidification, the alloy element is concentrated in the liquid phase, whereby the concentration of the alloy element in the liquid phase is increased. By the influence of such concentration change, the concentration of the alloy element in the solid phase increases from the initial part to the ending part of the solidification.

When a peritectic element such as Ti or V is added to aluminum, a phenomenon contrary to the above appears. Then, only a single crystal having a nonuniform distribution of the added element is obtained, and such a single crystal is not suitable for a sputtering target material.

The above phenomena are significant, particularly when the diameter or longitudinal size of the target which can be set in the sputtering apparatus is 100 mm or larger. Accordingly, there has not been known any sputtering target of a single crystal aluminum alloy having a uniform distribution of an added element.

SUMMARY OF THE INVENTION

An object of the present invention is to provide a sputtering target of a single crystal aluminum alloy which has a uniform distribution of an added element, controlled crystal orientations and a size suitable for setting in a sputtering apparatus.

As a result of extensive study on a method for producing a sputtering target of a single crystal aluminum alloy which satisfies the above properties, it has been found that, when the pulling direction, the casting temperature and a casting rate are controlled, the single crystal grows, the solid-liquid separation of a solute does not occur macroscopically, and a single crystal having a uniform concentration distribution and a size suitable for setting in the sputtering apparatus, which has not been able to be produced by the conventional methods, can be produced. Further, it has been found that, when the alloy is continuously casted under a specific intermittent pulling condition, it is easily single crystallized to provide a single crystal of the alloy, which has a decreased number of bubbles in its interior, a smoother cast surface, a uniform concentration distribution, and a size suitable for setting in the sputtering apparatus. As a result, the present invention has been completed.

Accordingly, the present invention provides a method for producing a sputtering target of a single crystal aluminum alloy by a continuous casting apparatus equipped with a starting rod, which method comprises directionally solidifying a melt of aluminum having a purity of at least 99.9 wt. % which contains 0.1 to 3.0 wt. % of at least one metal element selected from the group consisting of elements having atomic numbers of 3 to 83, at a casting temperature of 670 to 850° C. at a casting rate of 1 to 80 m/min. in one direction while maintaining the angle between the center axis of a continuous casting mold and the direction of pulling a casting material at 2 degrees or less.

DETAILED DESCRIPTION OF THE INVENTION

Since the sputtering process can form a high quality thin film, has a high productivity and reduces damage to the substrate to be coated, it is widely used in industries for the production of a reflection film of an optical disc, a light shielding film, a moisture proof film, a wiring material of an LSI, an electrode wiring of a liquid crystal display, and so on.

When a single crystal aluminum alloy containing various elements is used as a sputtering target, properties of the formed film can be adjusted according to the applications and objects of the films.

The high purity aluminum to be used as a material of the target sould have a purity of at least 99.9 wt. %.

A metal element to be added to the target material is at least one of the elements having the atomic number of 3 to 83. Preferred examples of such elements are Ag, Au, Ca, Co, Cr, Cu, Fe, Ge, Hf, In, Li, Mg, Mn, Mo, Na, Nb, Ni, Si, Sn, Ta, Ti, V, W and Zr. When the target comprising the high purity aluminum and at least one of these metal elements is used, a thin film having improved reflectance, corrosion resistance, heat resistance and strength can be formed on the substrate.

In particular, when the aluminum alloy is used as a wiring material of a LSI (Large Scale Integrated Circuit), a single crystal aluminum alloy containing Cu and/or Si is preferably used as a target. Thereby, it is possible to accommodate the target to the narrowing of the wire width.

The total amount of the added elements is from 0.1 to 3 wt. % based on the weight of aluminum. When the total amount of the added elements is less than 0.1 wt. %, the difference of an absolute value of the concentration distribution of the added element due to the segregation is small even in the conventional method, and no problem arises. When this total amount exceeds 3 wt. %, it is difficult to obtain a single crystal alloy even in the present invention.

Figure 1A:
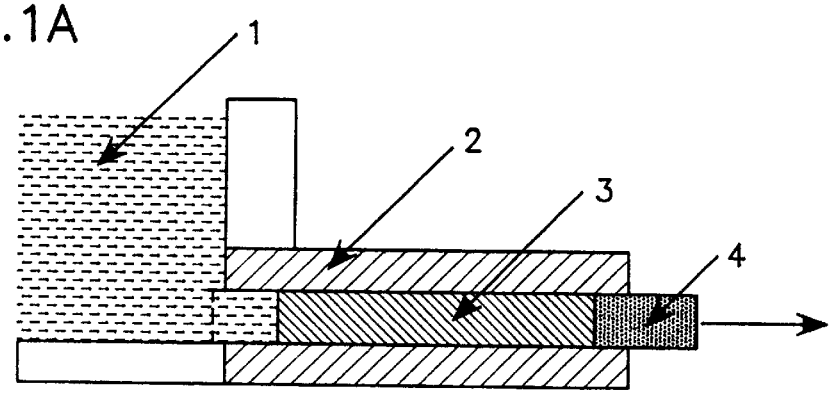
FIG. 1A schematically shows one example of the casting apparatus to be used in the method for producing a plate shape single crystal of an aluminum alloy.
Figure 1B:
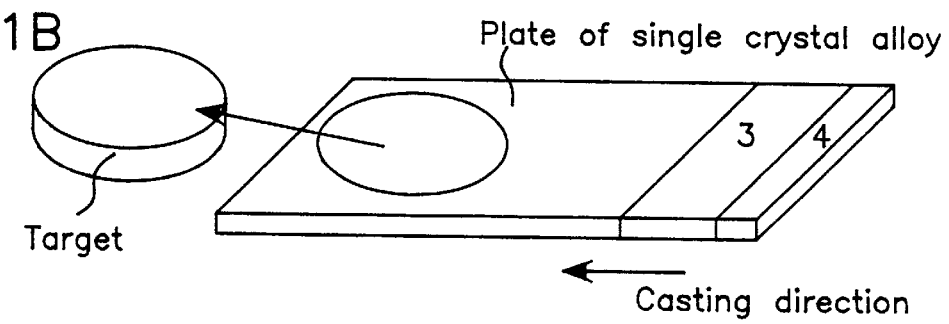
FIG. 1B is a perspective view of a plate shape single crystal produced by the apparatus of FIG. 1A, FIG. 2A schematically shows one example of the casting apparatus to be used in the method for producing a rod shape single crystal of an aluminum alloy.
Figure 2A:
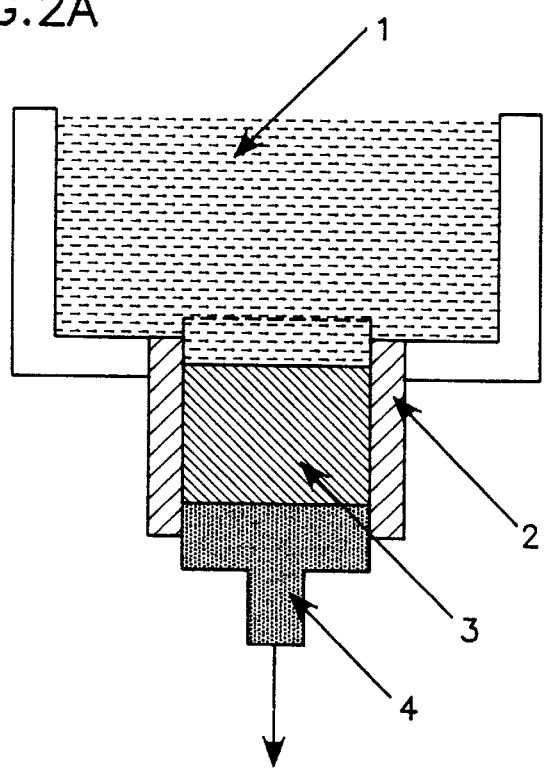
FIG. 2B is a perspective view of a rod shape single crystal produced by the apparatus of FIG. 2A.

As shown in FIGS. 1A and 2A, a continuous casting apparatus, which is used in the production of the aluminum sputtering target according to the present invention, comprises a casting mold 2 (continuous casting mold) having a starting rod 4 to which a seed crystal 3 is attached. By continuously pulling the starting rod 4, an elongate product having a cross section of a square, a rectangle, a round, etc. can be produced from the melt 1. The continuous casting mold is preferably made of, for example, an aluminum alloy, copper, or graphite which will be less deformed and requires no lubricant.

In the method of the present invention, an angle between the center axis of the casting mold and a direction of pulling a cast material should be 2 degrees or less, preferably 1 degree or less. When this angle exceeds 2 degrees, a mold wall and a casted material scratch each other, or continuity between the solid phase and the liquid phase in the casting mold is interrupted to form a neck. From the scratched part or the neck portion, a crystal having a crystal orientation different from that of the already casted crystal may grow, or the crystal orientation may gradually change.

Herein, the casting temperature is a temperature of the melt to be supplied in the casting mold just before entering an inlet of the mold. The continuous casting can be carried out, as long as the casting temperature is higher than a melting point or solidifying point of the aluminum alloy to be casted. A casting temperature range is preferably from 670° C. to 850° C., more preferably from 680° C. to 820° C. When the casting temperature is lower than 670° C., the melt of the alloy is solidified by disturbance of the temperature caused by external causes such as vibration of the casting apparatus, or internal causes such as change of the flow of the melt by the pulling of the casting material, whereby the smooth continuous casting may be prevented. When the casting temperature exceeds 850° C., the casting apparatus should have an ability for melting the raw material alloy and a cooling ability which correspond to the high casting temperature. Such high abilities lead to unnecessary increase of a production cost.

Unlimited examples of a method for melting the aluminum alloy include a direct heating method using, for example, high frequency wave, a method for melting the alloy in a melting furnace, and so on.

The melt of the aluminum alloy is charged in the continuous casting apparatus. To maintain the temperature of the melt in a range between 670° C. and 850° C., the casting apparatus may be equipped with cooling means, heat-insulating means, heating means, etc.

The casting rate means a length of the casted material which is pulled per unit time. When the casting rate is less than 1 mm/min., the added metal element is segregated macroscopically because of the solid-liquid distribution effect of the solute elements, and the produced target has a low commercial value. When the casting rate exceeds 80 mm/min., it is difficult to cast the alloy in the single crystal form. Accordingly, the casting rate is generally from 1 mm/min. to 80 mm/min., preferably from 3 mm/min. to 50 mm/min., more preferably from 5 mm/min. to 30 mm/min.

In the continuous casting method of the present invention, an intermittent pulling method is preferably employed. The intermittent pulling method repeats alternately a step of pulling the casting material for a predetermined time or a predetermined length at a suitable rate, and a step of stopping the pulling for a predetermined time. The intermittent pulling can be carried out using a hydraulic mechanism, or a mechanism comprising a motor, a reducing gear, a clutch, and so on. The intermittent pulling method makes the solidification in the mold more regular, and the control of the rate of single crystallization more easy, and provides a more smooth cast surface.

The pulling ratio is the ratio of a pulling time (a time necessary for pulling) to the sum of the pulling time and the stationary time (the time of one cycle of the intermittent pulling), which is expressed by "percentage (%)". When the pulling ratio is less than 1%, the surface of the casted material is roughened due to seize. At a pulling ratio exceeding 80%, when the pulling pitch is short, the material is broken in the mold, while when the pulling pitch is long, the melt of the aluminum alloy tends to overflow the mold. Accordingly, the pulling ratio is usually from 1% to 80%, preferably from 2% to 50%, more preferably from 3% to 30%.

The pulling pitch is a length of the material which is pulled out in one cycle of the intermittent pulling, and preferably from 0.01 mm to 10 mm. When the pulling pitch is less than 0.01 mm, it is difficult to control the pitch stably, while when it exceeds 10 mm, the single crystal hardly grows.

It is possible to produce a rod or a plate of the single crystal by the continuous casting method of the present invention. The single crystal alloy having the intended crystal orientation can be easily obtained by providing a single crystal (seed crystal) having the specific crystal orientation on the starting rod or plate to which the casting material is bonded to pull out the material (see FIGS. 1A and 2A). In this case, the seed crystal used as the starting rod or plate is preferably a single crystal of an alloy containing the same additional element as that in the intended alloy, while it may not need to be a single crystal of an alloy, and a single crystal of aluminum and so on may be used, if it contains a small amount of an impurity or impurities.

The seed crystal is placed so that its front end reaches the melt of the aluminum alloy so that a part of the seed crystal is molten completely. The seed crystal is preferably attached to the starting rod with a screw or by fitting. Thereby, the solidification can proceed easily with tracing the orientation of the seed crystal.

When the crystal orientation on an evaporation surface of the single crystal alloy target having the uniform concentration of the added metal element is controlled in, for example, (111), the deposition rate of the aluminum thin film by the sputtering process is greatly increased. When the crystal orientation of a plane at the target in parallel with the substrate is controlled in (110), the emitted atoms by sputtering have a high straight advancing property, and impact the substrate from a vertical direction, so that a step coverage is good, and a thin film can be effectively formed in a contact hole having a high aspect ratio.

The sputtering target of the single crystal aluminum alloy which is produced by the above method may be of any shape such as a planar shape, a disc, a cylinder, or a shape a center part of which is hollowed. Irrespective of the shape, the target has a diameter or longitudinal size of 100 mm to 1500 mm. When the diameter or the longitudinal size is smaller than 100 mm, a difference of an absolute value of the concentration distribution of the added element is not large even in the prior art, and no problem arises. When it exceeds 1500 mm, the handling of the sputtering target is difficult, though the single crystal of the aluminum alloy having the size exceeding 1500 mm may be produced.

Figure 2B:
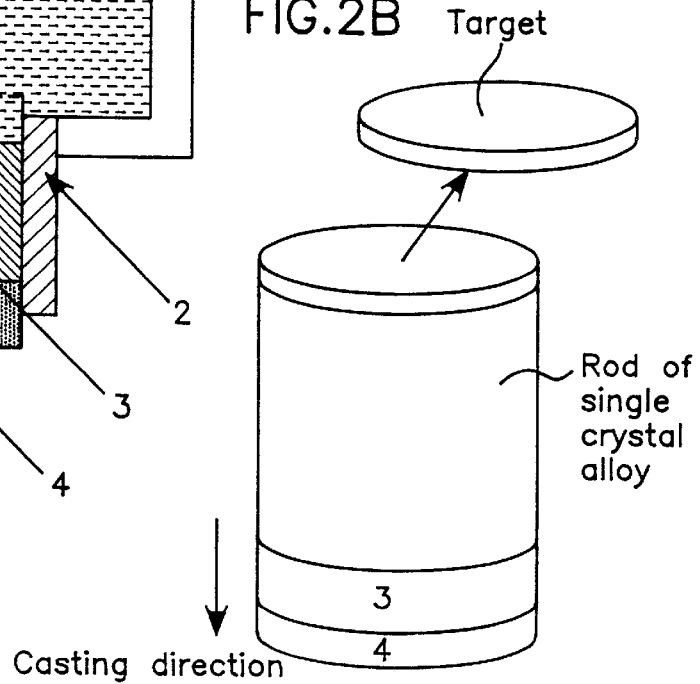

According to the present invention, a continuously casted single crystal material of a rod or plate shape having the uniform concentration distribution of the added element can be obtained in any length. For example, a sputtering target of the single crystal aluminum alloy having a diameter of 100 mm and a thickness of 10 mm can be obtained by slicing a rod of the continuously casted single crystal material having a diameter of 100 mm to a thickness of 10 mm (see FIG. 2B), or by cutting out a disc having a diameter of 100 mm from a plate of the continuously casted single crystal material having a thickness of 10 mm (see FIG. 2A).

A deviation of the concentration distribution of the added element is expressed by the formula:

[(maximum concentration−minimum concentration)/(maximum concentration+minimum concentration)]×100

This deviation of the concentration distribution is preferably±5%. In this range, the single crystal is suitably used as the sputtering target.

According to the present invention, the sputtering target of the aluminum alloy having the uniform concentration of the added element and the controlled crystal orientation can be obtained. When an aluminum thin film is formed by the sputtering process using the target of the present invention, an aluminum thin film having good film forming properties such as a film formation rate and step coverage, and containing the added element at a uniform concentration can be formed.

EXAMPLES

The present invention will be illustrated by the following Examples, which do not limit the scope of the present invention in any way.

EXAMPLE 1

In a melt of aluminum having a purity of 99.99%, 0.53 wt. % of copper having a purity of 99.9% was added and molten completely at 800° C. Using the casting apparatus of FIG. 1A having a graphite made mold 2 having an inner size of 55 mm×15 mm which was horizontally attached to the bottom of the crucible, the melt 1 of the aluminum alloy was casted by the intermittent pulling method at a casting rate of 12 mm/min. with keeping a melt temperature at 740° C. at the bottom of the crucible just before entering in the mold, and adjusting and maintaining an angle between the center axis of the mold and the pulling direction to 1 degree or less, to obtain a plate shape casted material having a length of 1500 mm. The intermittent pulling was carried out at a pulling ratio of 6.7% and a pulling pitch of 0.4 mm.

The crystal orientation of the casted material was controlled by the use of a seed crystal 3 having the (110) orientation on the upper plane surface of the plate, which was attached to the starting rod 4, and the obtained single crystal had the (110) orientation on its upper plane surface having the width of 55 mm.

For the measurement of the crystal orientation, a piece was cut off from each of the casting starting end and the finishing end in a length of 40 mm from each edge to obtain each sample. A measuring surface of the sample was lathed at a surface layer of about 1 mm and a thin layer which was deformed by lathing was removed by aqua regia. Then, the crystal orientation was determined from a pole figure which was measured in the Schultz reflection method using an X-ray diffraction apparatus (RU-200 manufactured by RIGAKU Co., Ltd.), whereby it was confirmed that the single crystal grew continuously from the seed crystal.

The produced single crystal of the aluminum alloy was cut to obtain a planar target having a length of 500 mm, a width of 52 mm and a thickness of 12 mm, and a Cu distribution therein was measured with an emission spectral analyzer (CQM-75 manufactured by Shimadzu Corporation). The results are shown in the Table.

COMPARATIVE EXAMPLE 1

A single crystal of an aluminum alloy was produced by the Charmars method as follows:

A horizontal vacuum heating furnace having a quartz muffle with a diameter of 100 mm and a length of 1000 mm was used. A graphite made mold having an inner width of 60 mm, an inner length of 250 mm and a depth of 20 mm was placed in the muffle, and at one end of the mold, a seed crystal having a length of 80 mm and the (110) orientation on its surface was provided.

A melt of aluminum having a purity of 99.99% containing 0.49 wt. % of copper was charged in the middle part of the mold and kept at 800° C. After melting the tip end of the seed crystal, the melt of the alloy was solidified by moving the heating furnace at a solidification rate of 0.43 mm/min. from the seed crystal side to obtain a plate form single crystal of the alloy having a width of 55 mm, a length of 180 mm and a thickness of 15 mm.

In the same manner as in Example 1, the obtained single crystal of the alloy was cut, and the Cu distribution therein was measured. The results are shown in the Table.

COMPARATIVE EXAMPLE 2

In the same manner as in Example 1 except that the aluminum alloy was casted in a pulling direction which deviated on the left side 2.3 degrees from the axis of the mold when viewed from upward, a plate shape crystal having a length of 1300 mm was produced.

A front end part of the plate from 200 to 400 mm was cut and each cut faces were lathed by 1 mm. The macrostructure of the crystal was observed by etching to find that the crystal was poly-crystal crystal in which many crystals grew from the side face on the left side in relation to the pulling direction when viewed from upward.

TABLE

| Distance from one end of target (mm) | Analytical value of copper (wt. %) | |
|---|---|---|
| | Example 1 | Comp. Ex. 1 |
| 50 | 0.53 | 0.20 |
| 95 | 0.53 | 0.41 |
| 140 | 0.54 | 0.75 |
| 185 | 0.54 | — |
| 315 | 0.53 | — |
| 450 | 0.54 | — |
| Concentration deviation (%) | ±0.9 | ±58 |

What is claimed is:

1. A sputtering target of a single crystal aluminum alloy comprising aluminum having a purity of at least 99.9 wt. % which contains 0.1 to 3.0 wt. % of at least one added metal element selected from the group consisting of elements having atomic numbers of 3 to 83, and having a diameter or longitudinal size of 100 mm to 1500 mm and a deviation of concentration of the added metal element of ±5% or less in a diameter direction or a longitudinal direction, wherein the crystalline orientation on the surface of the single crystal is a <111> or <110> orientation.

2. The sputtering target according to claim 1 wherein said at least one element is selected from the group consisting of Ag, Au, Ca, Co, Cr, Cu, Fe, Ge, Hf, In, Li, Mg, Mn, Mo, Na, Nb, Ni, Si, Sn, Ta, Ti, V, W and Zr.

3. The sputtering target according to claim 1 wherein said at least one element is selected from the group consisting of Cu and Si.

* * * * *